(12) United States Patent
Jo et al.

(10) Patent No.: US 10,158,331 B2
(45) Date of Patent: Dec. 18, 2018

(54) POWER AMPLIFYING APPARATUS WITH BOOST FUNCTION

(71) Applicant: SAMSUNG ELECTRO-MECHANICS CO., LTD., Suwon-si (KR)

(72) Inventors: Byeong Hak Jo, Suwon-si (KR); Jeong Hoon Kim, Suwon-si (KR); Hyun Hoon Paek, Suwon-si (KR); Jong Ok Ha, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/794,431

(22) Filed: Oct. 26, 2017

(65) Prior Publication Data
US 2018/0331658 A1 Nov. 15, 2018

(30) Foreign Application Priority Data
May 10, 2017 (KR) .......................... 10-2017-0058113

(51) Int. Cl.
H03F 1/30 (2006.01)
H03F 1/02 (2006.01)
H03F 3/195 (2006.01)
H03F 3/213 (2006.01)

(52) U.S. Cl.
CPC ........... *H03F 1/0233* (2013.01); *H03F 3/195* (2013.01); *H03F 3/213* (2013.01); *H03F 2200/135* (2013.01); *H03F 2200/451* (2013.01); *H03F 2200/555* (2013.01); *H03F 2200/78* (2013.01)

(58) Field of Classification Search
CPC ........................................................ H03F 1/30

USPC ......................................... 330/297, 296, 285
See application file for complete search history.

(56) References Cited

U.S. PATENT DOCUMENTS

| | | | | |
|---|---|---|---|---|
| 6,566,944 B1 * | 5/2003 | Pehlke | ................. | H03F 1/0233 330/10 |
| 7,728,663 B2 * | 6/2010 | Rabjohn | ............... | H03F 1/0255 330/124 R |
| 8,981,847 B2 * | 3/2015 | Balteanu | .................... | H03F 1/02 330/136 |

(Continued)

FOREIGN PATENT DOCUMENTS

| KR | 10-2016-0100800 A | 8/2016 |
|---|---|---|
| KR | 10-2016-0100801 A | 8/2016 |

OTHER PUBLICATIONS

Yushan Li, "High Efficiency Power Supplies for Multi-Mode RF Power Amplifiers in Cellular Handset Applications", *Ph.D. Thesis*, University of Colorado, 2012 (161 pages in English).

(Continued)

*Primary Examiner* — Henry Choe
(74) *Attorney, Agent, or Firm* — NSIP Law

(57) ABSTRACT

A power amplifying apparatus includes a control circuit generating a bias voltage and generating a control signal using a battery voltage and a reference voltage, and a power amplifying circuit boosting the battery voltage according to the control signal to provide an operating voltage, and operating according to the bias voltage and the operating voltage to amplify an input signal, wherein the power amplifying circuit detects the operating voltage and provides a detection voltage to the control circuit, and the control circuit controls the control signal according to the detection voltage.

14 Claims, 4 Drawing Sheets

(56) References Cited

U.S. PATENT DOCUMENTS

2006/0087375 A1    4/2006  Hong
2015/0180518 A1*  6/2015  Whittaker ............... H03F 3/245
                                                         455/127.2

OTHER PUBLICATIONS

Korean Office Action dated Apr. 11, 2018 in corresponding Korean Patent Application No. 10-2017-0058113 (11 pages in English and 8 pages in Korean).

* cited by examiner

POWER AMPLIFYING APPARATUS WITH BOOST FUNCTION

CROSS-REFERENCE TO RELATED APPLICATION(S)

This application claims the benefit under 35 USC § 119 (a) of Korean Patent Application No. 10-2017-0058113 filed on May 10, 2017 in the Korean Intellectual Property Office, the entire disclosure of which is incorporated herein by reference for all purposes.

BACKGROUND

1. Field

The following description relates to a power amplifying apparatus having a boost function.

2. Description of Related Art

A power amplifier module (PAM) amplifies a radio frequency (RF) signal output from a transmitter and transmits an amplified RF signal to an antenna. Since the PAM supports various frequency bands, the PAM may include a plurality of switches and filters and a plurality of power amplifiers (PAs) amplifying an RF signal.

The performance of the PAM is evaluated by criteria such as, for example, maximum output, efficiency, and linearity. Also, since the PAM uses a relatively large amount of current in a mobile phone, current consumption is another evaluation item.

To reduce current consumption of the PAM, average power tracking (APT) or envelope tracking (ET) may be used. APT is a method of increasing efficiency by adjusting the operating voltage Vcc according to average output power, while ET is a method of changing a power source voltage of a PA according to an envelope of an RF signal. ET is a method of lowering a PA power source voltage for a portion of an RF signal with a small amplitude to reduce average power consumption and to increase the PA power source voltage for a portion of the RF signal with a large amplitude to prevent degradations of linearity.

APT is a method of letting a VCC follow an average value for a time period, whereas ET is a method of letting a VCC follow an instantaneous output, requiring an ET modulator for generating a VCC that simultaneously follows an envelope signal.

Recently, high voltage power amplifiers have been actively researched. A high voltage power amplifier (PA) may include a PA including a DC booster that boosts a battery voltage using a VCC higher than a battery voltage (VBAT). Thus, efficiency of the PA is improved by boosting a battery voltage by three to four times using the DC booster.

The high voltage PA is advantageous in that a circuit for matching is reduced in size due to an increase in load impedance and efficiency is improved. However, in order to apply such a high voltage PA, a DC/DC converter (DC booster) IC is additionally required, leading to an increase in an overall module size. An existing high voltage PA may include a bias circuit, an HV power source circuit, and an HV PA.

In cases where the existing high voltage PA is realized as a single module, if the bias circuit, the HV power source circuit, and the HV PA each are realized as an IC or an assembly, at least three ICs or assemblies are required. In particular, the bias circuit is manufactured through a complementary metal-oxide semiconductor (CMOS) process, the HV power source circuit is manufactured through a laterally diffused metal oxide semiconductor (LD-MOS) process, and the HV PA is manufactured through a hetero-junction bipolar transistor (HBT) process. That is, since the bias circuit, the HV power source circuit, and the HV PA are manufactured as three ICs through separate manufacturing processes, the existing high voltage PA is not very compact.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a power amplifying apparatus including a control circuit configured to generate a bias voltage and to generate a control signal using a battery voltage and a reference voltage, and a power amplifying circuit configured to boost the battery voltage according to the control signal to provide an operating voltage, to amplify an input signal according to the bias voltage and the operating voltage, and to provide a detection voltage to the control circuit based on the operating voltage, wherein the control circuit may be configured to control the control signal according to the detection voltage.

The control circuit may include a bias circuit configured to generate the bias voltage and the reference voltage using the battery voltage, and a high voltage power controller configured to generate the control signal using the battery voltage and the reference voltage, and to control the control signal according to the detection voltage.

The power amplifying circuit may include a direct current (DC) booster circuit configured to boost the battery voltage according to the control signal to provide the operating voltage, an amplifying circuit configured to amplify an input signal according to the bias voltage and the operating voltage, and a feedback detection circuit configured to detect the operating voltage and to provide the detection voltage to the high voltage power controller.

The high voltage power controller may include a voltage input circuit configured to divide the detection voltage to provide a feedback voltage, an error amplifying circuit configured to provide an error voltage between the feedback voltage and the reference voltage, a comparison circuit configured to compare the error voltage with a triangular wave voltage to provide a pulse wave voltage, and a driving circuit configured to convert the pulse wave voltage into the control signal.

The control circuit may be manufactured through a complementary metal-oxide semiconductor (CMOS) process.

The power amplifying circuit may be manufactured through a hetero-junction bipolar transistor (HBT) process.

The amplifying circuit may include a driving amplifier configured to amplify the input signal based on the battery voltage and the bias voltage, and to output the amplified input signal to a power amplifier, and the power amplifier being configured to amplify the received amplified input signal based on the bias voltage and the operating voltage.

The comparison circuit may be configured to provide the pulse wave voltage having a low level voltage, in response to the error voltage being lower than the triangular wave voltage.

The comparison circuit may be configured to provide the pulse wave voltage having a high level voltage, in response to the error voltage being higher than the triangular wave voltage.

In another general aspect, there is provided a power amplifying apparatus including a control circuit configured to generate a bias voltage and to generate a control signal using a battery voltage and a reference voltage, and a power amplifying circuit configured to boost the battery voltage according to the control signal to provide an operating voltage, and to amplify an input signal according to the battery voltage, the bias voltage, and the operating voltage, and to provide a detection voltage to the control circuit based on the operating voltage, wherein the control circuit is configured to control the control signal according to the detection voltage, and the power amplifying circuit includes a driving amplifier that operates upon receiving the battery voltage and the bias voltage, and a power amplifier that operates upon receiving the bias voltage and the operating voltage.

The control circuit may include a bias circuit configured to generate the bias voltage and the reference voltage using the battery voltage, and a high voltage power controller configured to generate the control signal using the battery voltage and the reference voltage, and to control the control signal according to the detection voltage.

The power amplifying circuit may include a direct current (DC) booster circuit configured to boost the battery voltage according to the control signal to provide the operating voltage, an amplifying circuit including the driving amplifier and the power amplifier and being configured to amplify an input signal, and a feedback detection circuit configured to detect the operating voltage and to provide the detection voltage to the high voltage power controller.

The high voltage power controller may include a voltage input circuit configured to divide the detection voltage to provide a feedback voltage, an error amplifying circuit configured to provide an error voltage between the feedback voltage and the reference voltage, a comparison circuit configured to compare the error voltage with a triangular wave voltage to provide a pulse wave voltage, and a driving circuit configured to convert the pulse wave voltage into the control signal.

The control circuit may be manufactured through a complementary metal-oxide semiconductor (CMOS) process.

The power amplifying circuit may be manufactured through a hetero-junction bipolar transistor (HBT) process.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
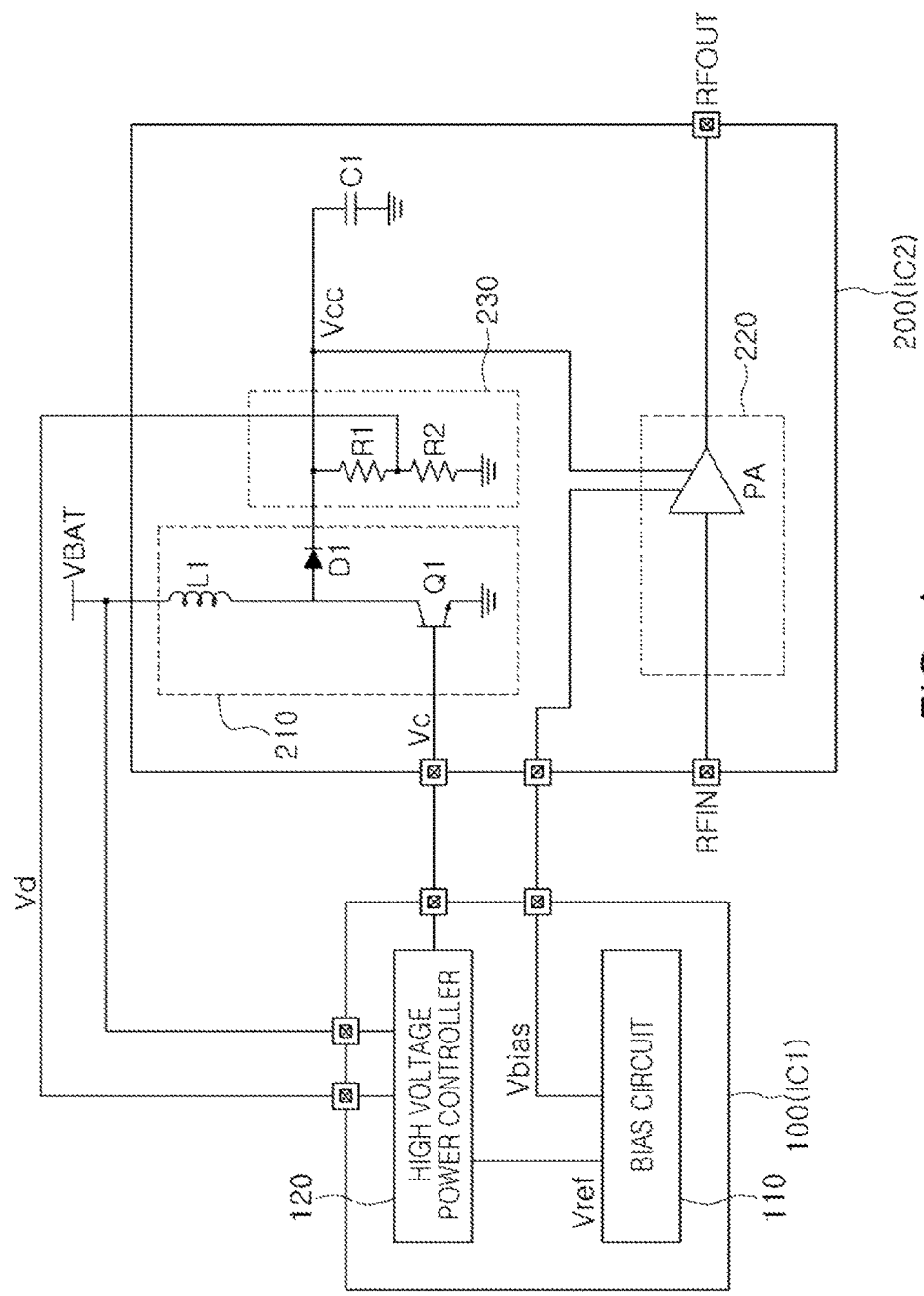
FIG. 1 is a diagram illustrating an example of a power amplifying apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or wafer (substrate), is described as being "on," "connected to," or "coupled to" another element, it can be directly "on," "connected to," or "coupled to" the other element, or there may be other elements intervening therebetween. In contrast, when an element is referred to as being "directly on," "directly connected to," or "directly coupled to" another element, there can be no other elements or layers intervening therebetween. As used herein, the term "and/or" includes any and all combinations of one or more of the associated listed items.

Although terms such as "first," "second," and "third" maybe used herein to describe various members, components, regions, layers, and/or sections, these members, components, regions, layers, and/or sections are not to be limited by these terms. Rather, these terms are only used to distinguish one member, component, region, layer, or section from another member, component, region, layer, or, section. Thus, a first member, component, region, layer, or section referred to in an example below could also be referred to as a second member, component, region, layer, or section without departing from the teachings of the example.

Spatially relative terms, such as "above," "upper," "below," and "lower," may be used herein for ease of description to describe one element's relationship to another element as shown in the figures. Such spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements. Thus, the term "above" can encompass both the above and below orientations depending on a particular direction of the figures. The device may be otherwise oriented (rotated 90 degrees or at other orientations), and the spatially relative terms used herein are to be interpreted accordingly.

The terminology used herein is for describing particular examples only, and is not intended to limit the disclosure. The terms "a," "an," and "the" include the plural forms as well, unless the context clearly indicates otherwise. As used herein, the term "and/or" includes any one and any combination of any two or more of the associated listed items.

Due to manufacturing techniques and/or tolerances, Variations of the shapes shown in the drawings maybe occur. Thus, the examples described below are not to be construed as being limited to the particular shapes of regions shown in the drawings, but include changes in shape occurring during manufacturing.

Figure 2:
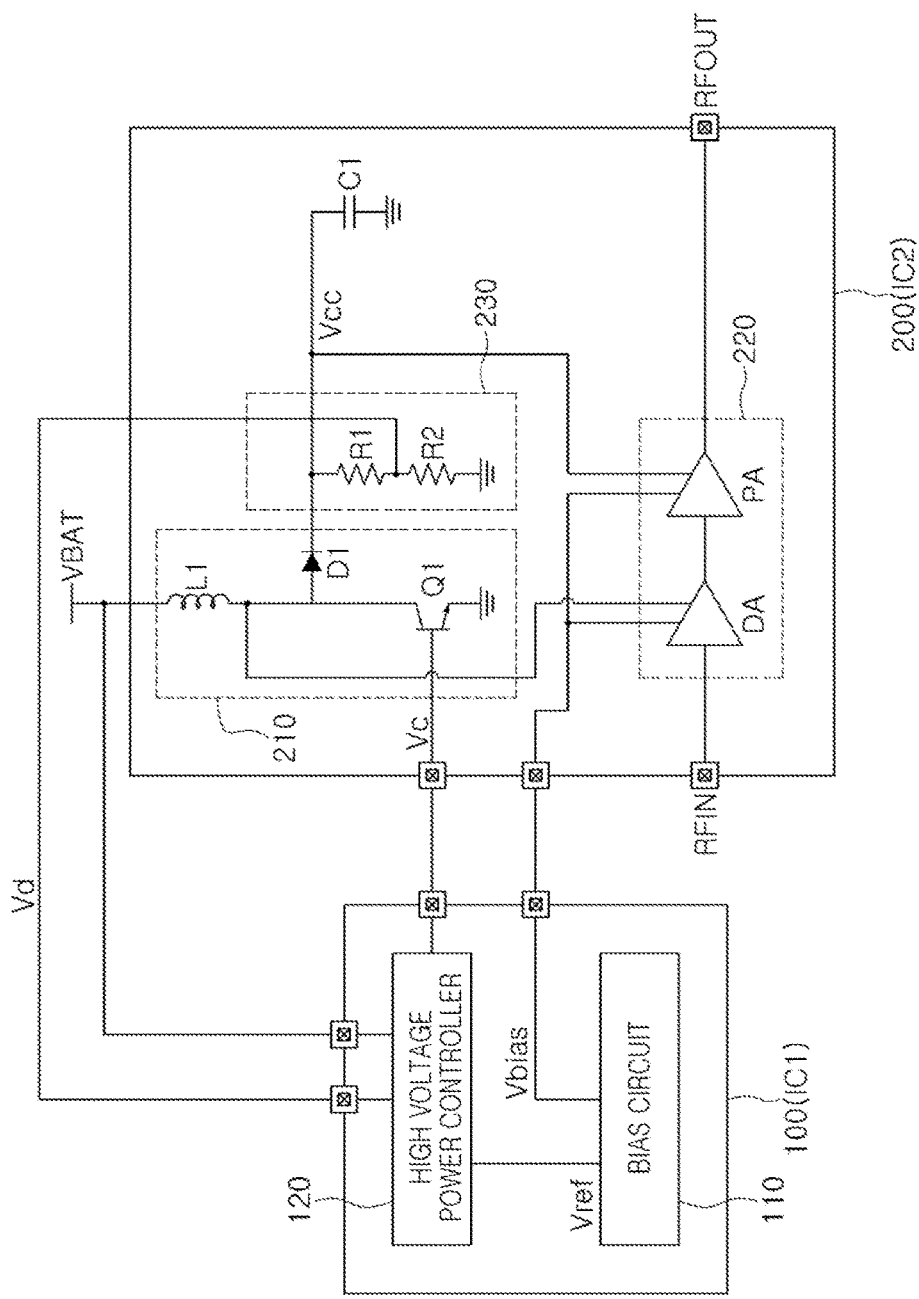
FIG. 2 is a diagram illustrating an example of a power amplifying apparatus.

FIG. 1 is a diagram illustrating an example of a power amplifying apparatus, and FIG. 2 is a diagram illustrating an example of a power amplifying apparatus.

Referring to FIGS. 1 and 2, the power amplifying apparatus includes a control circuit 100 and a power amplifying circuit 200.

In an example, the control circuit 100 generates a bias voltage Vbias and generate a control signal Vc using a battery voltage VBAT and a reference voltage Vref.

For example, the control circuit 100 includes a bias circuit 110 and a high voltage power controller 120. In an example, the bias circuit 110 generates the bias voltage Vbias and the reference voltage Vref using the battery voltage VBAT.

In an example, the high voltage power controller 120 generates the control signal Vc using the battery voltage VBAT and the reference voltage Vref, and controls the control signal Vc according to a detection voltage Vd.

In an example, the power amplifying circuit 200 steps up (or boosts) the battery voltage VBAT according to the control signal Vc and provides an operating voltage Vcc. The power amplifying circuit 200 amplifies an input signal according to the operating voltage Vcc.

For example, the operating voltage Vcc may differ according to a frequency band or power mode. In an example, the control signal Vc is a signal appropriate for the frequency band or power mode.

The power amplifying circuit 200 may detect the operating voltage Vcc and provide a detection voltage Vd to the control circuit 100. In an example, the control circuit 100 controls the control signal Vc according to the detection voltage Vd.

In an example, the power amplifying circuit 200 includes a booster circuit 210 and an amplifying circuit 220. In another example, the power amplifying circuit 200 includes a direct current (DC) booster circuit 210, an amplifying circuit 220, and a feedback detection circuit 230.

The DC booster circuit 210 may step up the battery voltage VBAT according to the control signal Vc to provide the operating voltage Vcc.

In an example, the DC booster circuit 210 includes an inductor L1, a switch transistor Q1, and a diode D1. One end of the inductor L1 is connected to the battery voltage VBAT terminal and the other end of the inductor L1 is connected to a collector of the switch transistor Q1. The switch transistor Q1 includes the collector connected to the other end of the inductor L1, a base receiving the control signal Vc, and an emitter connected to a ground. The diode D1 includes an anode connected to the collector of the switch transistor Q1 and a cathode connected to the feedback detection circuit 230.

The switch transistor Q1 performs a switching operation according to the control signal Vc, and through a series of process in which an energy voltage accumulated in the inductor L1 is rectified through the diode D1 according to the switching operation, the battery voltage VBAT (e.g., 3.2 V to 4.7 V) may be stepped up to a higher operating voltage Vcc (e.g., 12 V to 20 V).

In an example, the amplifying circuit 220 operates according to the bias voltage Vbias and the operating voltage Vcc to amplify an input signal.

The feedback detection circuit 230 detects the operating voltage Vcc and provides the detection voltage Vd to the high voltage power controller 120.

In an example, the feedback detection circuit 230 includes a first resistor R1 and a second resistor R2 connected in series to an output terminal of the DC booster circuit 210 and a ground. In an example, the feedback detection circuit 230 provides the detection voltage Vd to the control circuit 100 from a connection node between the first resistor R1 and the second resistor R2.

Referring to FIG. 1, the amplifying circuit 220 includes a power amplifier (PA). In an example, the PA operates upon receiving the bias voltage Vbias and the operating voltage Vcc, amplifies the input signal, and output the amplified signal.

Referring to FIG. 2, in an example, the power amplifying circuit 220 includes a driving amplifier DA and a power amplifier PA.

In an example, the DA operates upon receiving the battery voltage VBAT and the bias voltage Vbias to amplify the input signal and output the amplified signal.

In an example, the PA operates upon receiving the bias voltage Vbias and the operating voltage Vcc to amplify a signal from the DA and output the amplified signal.

In FIGS. 1 and 2, C1 is an alternating current (AC) grounding capacitor for removing AC noise such as ripple from the operating voltage Vcc.

In an example, the control circuit 100 is a first integrated circuit (IC1) is manufactured through a complementary metal-oxide semiconductor (CMOS) process. Unlike the examples illustrated in FIGS. 1 and 2, in another example, the first capacitor C1 and the first inductor L1 may be disposed outside of the first IC IC1.

In an example, the power amplifying circuit 200 is a second IC IC2 that is manufactured through a heterojunction bipolar transistor (HBT) process.

Figure 3:
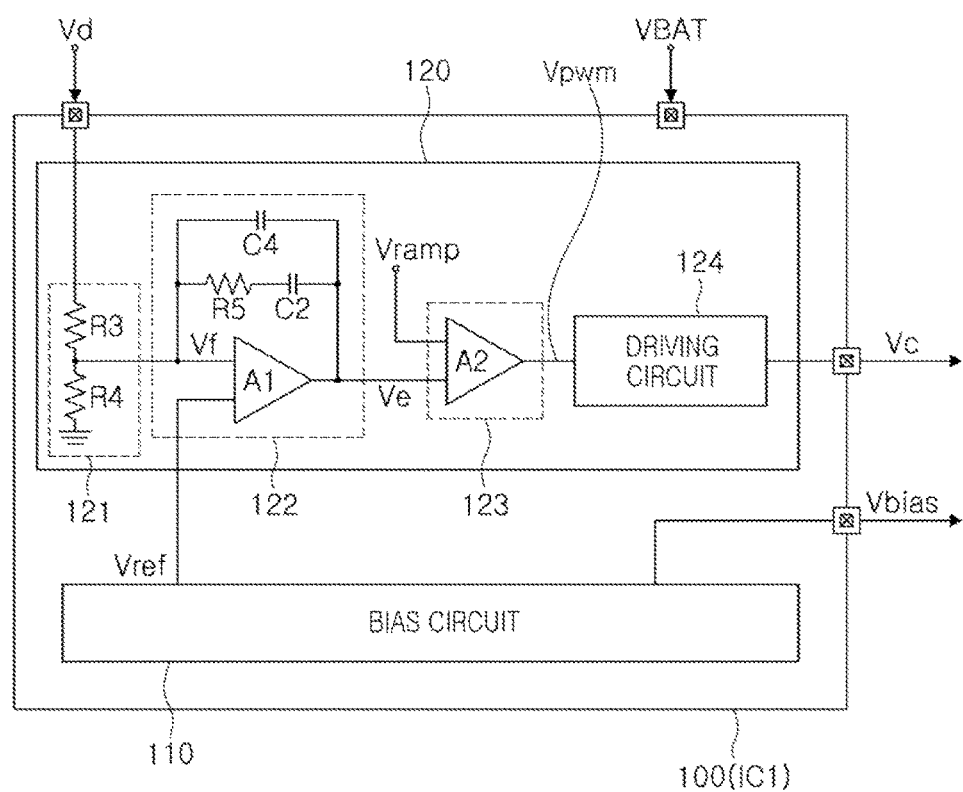
FIG. 3 is a diagram illustrating an example of a high voltage power controller.

FIG. 3 is a diagram illustrating an example of a high voltage power controller.

Referring to FIG. 3, in an example, the high voltage power controller 120 includes a voltage input circuit 121, an error amplifying circuit 122, a comparison circuit 123, and a driving circuit 124.

In an example, the voltage input circuit 121 divides the detection voltage Vd to provide a feedback voltage Vf. For example, the voltage input circuit 121 may include a third resistor R3 and a fourth resistor R4 connected in series between a terminal receiving the detection voltage Vd and a ground, and provide the feedback voltage Vf from a connection node between the third resistor R3 and the forth resistor R4.

In an example, the error amplifying circuit 122 provides an error voltage Ve between the feedback voltage Vf and the reference voltage Vref. For example, the error amplifying circuit 122 may include a first operational amplifier A1, a fifth resistor R5, and two capacitors C2 and C4. The first operational amplifier A1 may compare the feedback voltage Vf with the reference voltage Vref and provide the error voltage Ve corresponding to a difference between the two voltage.

The comparison circuit 123 may compare the error voltage Ve with a triangular wave voltage Vramp and provide a pulse wave voltage Vpwm. For example, the comparison circuit 123 may include a second operational amplifier A2. The second operational amplifier A2 may compare the error voltage Ve with the triangular wave voltage Vramp, and provide a pulse wave voltage Vpwm having a low level voltage when the error voltage Ve is lower than the triangular wave voltage Vramp, and a pulse wave voltage Vpwm having a high level voltage when the error voltage Ve is higher than the triangular wave voltage Vramp.

In an example, the driving circuit 124 converts the pulse wave voltage Vpwm into the control signal Vc. For example, the driving circuit 124 converts a level of the pulse wave voltage Vpwm into a level of the control signal Vc for controlling the DC booster circuit 210.

Figure 4:
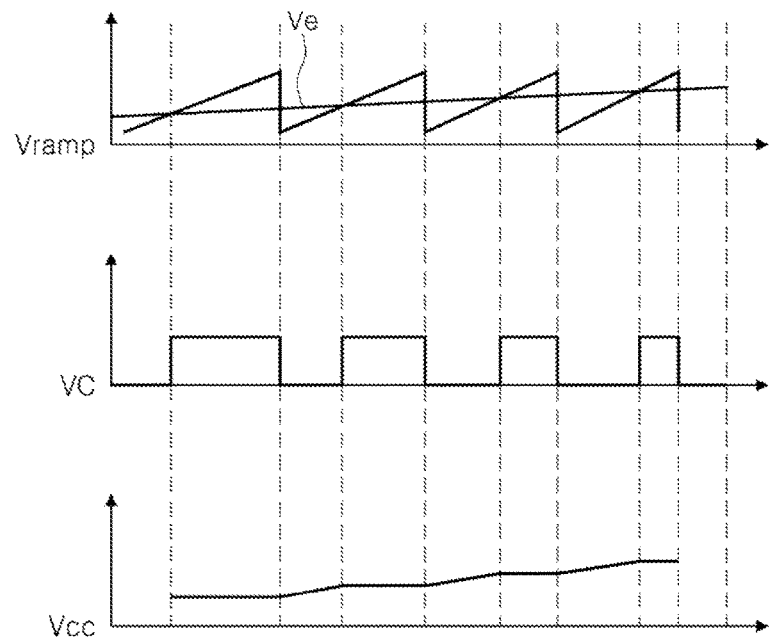
FIG. 4 is a diagram illustrating an example of a time chart of major signals.

FIG. 4 is a diagram illustrating an example of a time chart of major signals.

In FIG. 4, Ve is a voltage which is output from the error amplifying circuit 122 and corresponds to a difference voltage between the feedback voltage Vf and the reference voltage Vref. Vramp is a triangular wave voltage to be compared with the error voltage Ve by the comparison circuit 123.

Vc is a voltage converted in level from the pulse wave voltage Vpwm to control the DC booster circuit 210 in the driving circuit 124. Vcc is an operating voltage output from the DC booster circuit 210.

Figure 5:
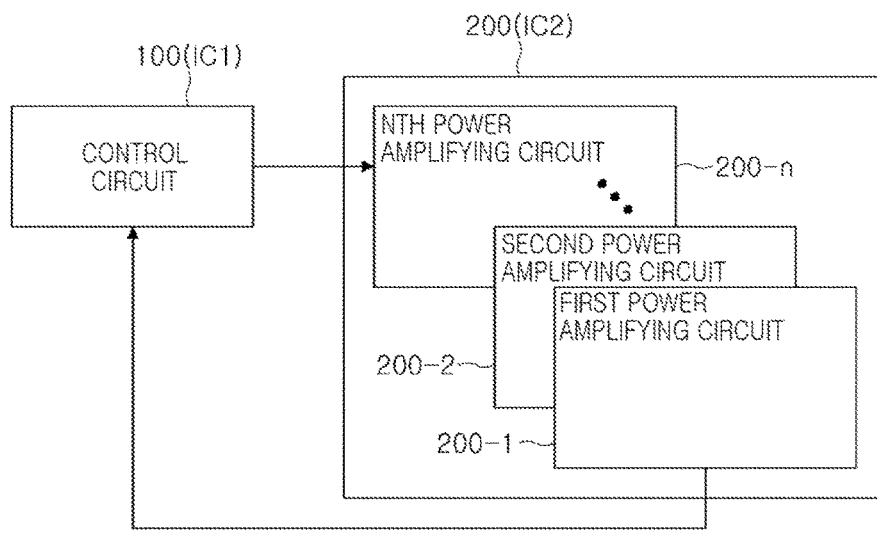
FIG. 5 is a diagram illustrating an example of a power amplifying apparatus.

FIG. 5 is a diagram illustrating another example of a power amplifying apparatus.

Referring to FIG. 5, a power amplifying apparatus may include a control circuit 100 and a power amplifying circuit 200, and the power amplifying circuit 200 includes a plurality of first, second, . . . , nth power amplifying circuits 200-1, 200-2, . . . , 200-n.

The first, second, . . . , nth power amplifying circuits 200-1, 200-2, . . . , 200-n may each have the structure of the power amplifying circuit illustrated in FIG. 1 or the structure of the power amplifying circuit illustrated in FIG. 2, and may operate for different frequency bands and operate in different power modes.

The control circuit 100 may control the first, second, . . . , nth power amplifying circuits 200-1, 200-2, . . . , 200-n to select a frequency band or control a power mode.

In an example, the control circuit 100 may be the first integrated circuit 101 which may be manufactured through the CMOS process, and the power amplifying circuit 200 may be the second 102 which may be manufactured through the HBT process.

According to the examples described above, since the power amplifying apparatus includes the two first IC and second IC, a size of the power apparatus is reduced and material cost is reduced.

As set forth above, since the number of ICs manufactured through different processes is reduced, a size is reduced, a boost voltage boosting a battery voltage is feedback-controlled, and accordingly, operating power is more precisely controlled.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifying apparatus comprising:
   a control circuit comprising
      a bias circuit configured to generate a bias voltage and a reference voltage using a battery voltage, and
      a high voltage power controller configured to generate a control signal using the battery voltage and the reference voltage; and
   a power amplifying circuit configured to boost the battery voltage according to the control signal to provide an operating voltage, to amplify an input signal according to the bias voltage and the operating voltage, and to provide a detection voltage to the control circuit based on the operating voltage,
   wherein the high voltage power controller is further configured to control the control signal according to the detection voltage.

2. The power amplifying apparatus of claim 1, wherein the power amplifying circuit comprises:
   a direct current (DC) booster circuit configured to boost the battery voltage according to the control signal to provide the operating voltage;
   an amplifying circuit configured to amplify an input signal according to the bias voltage and the operating voltage; and
   a feedback detection circuit configured to detect the operating voltage and to provide the detection voltage to the high voltage power controller.

3. The power amplifying apparatus of claim 1, wherein the high voltage power controller comprises:
   a voltage input circuit configured to divide the detection voltage to provide a feedback voltage;
   an error amplifying circuit configured to provide an error voltage between the feedback voltage and the reference voltage;
   a comparison circuit configured to compare the error voltage with a triangular wave voltage to provide a pulse wave voltage; and
   a driving circuit configured to convert the pulse wave voltage into the control signal.

4. The power amplifying apparatus of claim 1, wherein the control circuit is manufactured through a complementary metal-oxide semiconductor (CMOS) process.

5. The power amplifying apparatus of claim 1, wherein the power amplifying circuit is manufactured through a hetero-junction bipolar transistor (HBT) process.

6. The power amplifying apparatus of claim 2, wherein the amplifying circuit comprises:
   a driving amplifier configured to amplify the input signal based on the battery voltage and the bias voltage, and to output the amplified input signal to a power amplifier, and
   the power amplifier being configured to amplify the received amplified input signal based on the bias voltage and the operating voltage.

7. The power amplifying apparatus of claim 3, wherein the comparison circuit is further configured to provide the pulse wave voltage having a low level voltage, in response to the error voltage being lower than the triangular wave voltage.

8. The power amplifying apparatus of claim 3, wherein the comparison circuit is further configured to provide the pulse wave voltage having a high level voltage, in response to the error voltage being higher than the triangular wave voltage.

9. A power amplifying apparatus comprising:
a control circuit configured to generate a bias voltage and to generate a control signal using a battery voltage and a reference voltage; and
a power amplifying circuit configured to boost the battery voltage according to the control signal to provide an operating voltage, and to amplify an input signal according to the battery voltage, the bias voltage, and the operating voltage, and to provide a detection voltage to the control circuit based on the operating voltage, wherein
the control circuit is further configured to control the control signal according to the detection voltage, and
the power amplifying circuit comprises a driving amplifier that operates upon receiving the battery voltage and the bias voltage, and a power amplifier that operates upon receiving the bias voltage and the operating voltage.

10. The power amplifying apparatus of claim 9, wherein the control circuit comprises:
a bias circuit configured to generate the bias voltage and the reference voltage using the battery voltage; and
a high voltage power controller configured to generate the control signal using the battery voltage and the reference voltage, and to control the control signal according to the detection voltage.

11. The power amplifying apparatus of claim 10, wherein the power amplifying circuit comprises:
a direct current (DC) booster circuit configured to boost the battery voltage according to the control signal to provide the operating voltage;
an amplifying circuit including the driving amplifier and the power amplifier and being configured to amplify an input signal; and
a feedback detection circuit configured to detect the operating voltage and to provide the detection voltage to the high voltage power controller.

12. The power amplifying apparatus of claim 10, wherein the high voltage power controller comprises:
a voltage input circuit configured to divide the detection voltage to provide a feedback voltage;
an error amplifying circuit configured to provide an error voltage between the feedback voltage and the reference voltage;
a comparison circuit configured to compare the error voltage with a triangular wave voltage to provide a pulse wave voltage; and
a driving circuit configured to convert the pulse wave voltage into the control signal.

13. The power amplifying apparatus of claim 9, wherein the control circuit is manufactured through a complementary metal-oxide semiconductor (CMOS) process.

14. The power amplifying apparatus of claim 9, wherein the power amplifying circuit is manufactured through a hetero-junction bipolar transistor (HBT) process.

* * * * *